US005978263A

United States Patent [19]
Javanifard et al.

[11] Patent Number: 5,978,263
[45] Date of Patent: *Nov. 2, 1999

[54] NEGATIVE VOLTAGE SWITCH ARCHITECTURE FOR A NONVOLATILE MEMORY

[75] Inventors: Jahanshir J. Javanifard, Sacramento; Jeffrey J. Evertt, Orangevale, both of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/895,613

[22] Filed: Jul. 18, 1997

Related U.S. Application Data

[63] Continuation of application No. 08/742,366, Oct. 31, 1996, abandoned, which is a continuation of application No. 08/575,609, Dec. 20, 1995, abandoned.

[51] Int. Cl.$^6$ .................................................... G11C 11/34
[52] U.S. Cl. ............................... 365/185.11; 365/185.13; 365/185.23; 365/185.29; 365/195.33
[58] Field of Search .......................... 365/185.11, 185.13, 365/185.29, 185.33, 218, 185.23

[56] References Cited

U.S. PATENT DOCUMENTS

| 4,636,983 | 1/1987 | Young et al. ............................ 365/181 |
| 4,954,990 | 9/1990 | Vider ..................................... 365/185.21 |
| 5,126,808 | 6/1992 | Montalvo et al. ...................... 357/23.5 |
| 5,132,935 | 7/1992 | Ashmore, Jr. ........................ 365/185.19 |
| 5,198,998 | 3/1993 | Kobatake ............................. 365/189.09 |
| 5,253,201 | 10/1993 | Atsumi et al. ...................... 365/185.23 |
| 5,282,170 | 1/1994 | Van Buskirk et al. ................. 365/226 |
| 5,293,344 | 3/1994 | Akaogi .................................... 365/210 |
| 5,295,107 | 3/1994 | Okazawa et al. ........................ 365/218 |
| 5,311,480 | 5/1994 | Schreck ............................... 365/230.06 |
| 5,319,604 | 6/1994 | Imondi et al. ...................... 365/230.06 |
| 5,335,200 | 8/1994 | Coffman et al. ......................... 365/218 |
| 5,371,705 | 12/1994 | Nakayama et al. ................ 365/185.33 |
| 5,406,517 | 4/1995 | Chang et al. ....................... 365/189.09 |
| 5,455,789 | 10/1995 | Nakamura et al. ................. 365/185.17 |
| 5,477,499 | 12/1995 | Van Buskirk et al. .................. 365/218 |
| 5,491,656 | 2/1996 | Sawada .............................. 365/185.29 |
| 5,499,217 | 3/1996 | Pascucci et al. ................... 365/230.06 |
| 5,550,494 | 8/1996 | Sawada .............................. 365/185.23 |

OTHER PUBLICATIONS

International Search Report dated Feb. 2, 1997 for counterpart PCT application No. PCT/US96/19687.

*Primary Examiner*—Trong Phan
*Attorney, Agent, or Firm*—Blakely, Sokoloff, Taylor & Zafman

[57] ABSTRACT

A negative voltage switching circuit in a nonvolatile memory includes a switching transistor coupled to an output of the negative voltage switching circuit and a first voltage source that has a voltage level substantially lower than zero volts. A pull-up circuit is coupled to a control terminal of the switching transistor and selectively to a second voltage source having a voltage level substantially above zero volts. The pull-up circuit applies the second voltage source to the control terminal of the switching transistor when the pull-up circuit is coupled to the second voltage source such that the switching transistor does not couple the first voltage source to the output. A pull-down circuit is coupled to the first voltage source and the control terminal of the switching transistor. The pull-down circuit applies the first voltage source to the control terminal of the switching transistor when the pull-up circuit is not coupled to the second voltage source such that the switching transistor couples the first voltage source to the output.

22 Claims, 9 Drawing Sheets

5,978,263

NEGATIVE VOLTAGE SWITCH ARCHITECTURE FOR A NONVOLATILE MEMORY

This is a continuation of application Ser. No. 08/742,366, filed Oct. 31, 1996, now abandoned, which is a continuation of application Ser. No. 08/575,609, filed Dec. 20, 1995 abandoned.

FIELD OF THE INVENTION

The present invention pertains to the field of integrated circuits. More particularly, this invention relates to a voltage switching circuit that couples a negative voltage to a nonvolatile memory, thereby allowing negative gate voltage erasure of the nonvolatile memory.

BACKGROUND OF THE INVENTION

A prior flash electrically erasable and programmable read-only memory ("flash EPROM") typically uses memory cells that include electrically isolated gates (i.e., floating gates). Information is stored in the memory cells in the form of charge on the floating gates. FIG. 1 illustrates the structure of one such memory cell 10. Memory cell 10 includes a drain region 13 and a source region 14 in a substrate 15. Source region 14 and drain region 13 are asymmetrically doped with an arsenic dopant and source region 14 is additionally doped with a phosphorous dopant. A polysilicon floating gate 12 is generally disposed above and between these regions and insulated from these regions by an insulating layer 16. Floating gate 12 at the completion of processing is completely surrounded by insulating layers and electrically floats. A second gate (i.e., a control gate) 11 is disposed above floating gate 12 that is fabricated from a second layer of polysilicon. A second insulating layer 17 separates floating gate 12 from control gate 11.

As can be seen from FIG. 2A, memory cell 10 is programmed (i.e., negatively charging the floating gate) by coupling control gate 11 to a gate programming potential of approximately +12 volts, drain region 13 to a drain programming potential of approximately +7 volts, and source region 14 to ground. Under these conditions, channel hot electron injection occurs through oxide layer 16. The electrons deposited on floating gate 12 of memory cell 10 cause the threshold voltage of memory cell 10 to rise. Memory cell 10 is now programmed to have a programmed threshold voltage $V_{TP}$.

To erase cell 10, drain region 13 is floated, control gate 11 is grounded and an erasure potential of approximately +12 volts is applied to source region 14, as shown in FIG. 2B. Under these conditions, charge is tunneled from floating gate 12 to source region 14. This removes the electrons deposited on floating gate 12 of memory cell 10, causing the threshold voltage of memory cell 10 to decrease. Memory cell 10 is now erased to have an erased threshold voltage $V_{TE}$.

To read cell 10, a positive read potential less than that which would cause charge to transfer onto floating gate 12 is applied to control gate 11 (e.g., 5 volts) and a potential (e.g., 1 volt) is applied to drain region 13. Current through the device is sensed to determine if floating gate 12 is or is not negatively charged.

The speed at which memory cell 10 is erased largely depends on the erasure ability of memory cell 10 and the erasure voltage applied to the source of memory cell 10. Typically, the higher the erasure voltage applied to the source of memory cell 10, the faster memory cell 10 is being erased. However, one disadvantage of such prior art erasure technique is that if the erasure voltage applied to the source of memory cell 10 exceeds certain voltage threshold (e.g., 12 volts), the source-to-gate junction of memory cell 10 then moves into the breakdown region, at which hot holes are generated in floating gate 12 of memory cell 10. This is detrimental to the lifetime cycles of the memory cell. Therefore, the erasure voltage constraint typically limits the increase in the erasure speed of memory cell 10. In addition, when the source-to-gate junction of memory cell 10 is at the breakdown condition, the erasure speed of memory cell 10 does not increase when the erasure voltage increases.

SUMMARY OF THE INVENTION

One of the features of the present invention is to allow negative gate voltage erasure of memory cells of a nonvolatile memory.

Another feature of the present invention is to provide the negative gate voltage erasure for a nonvolatile memory with minimal number of device elements and minimized power consumption.

Another feature of the present invention is to reduce the die size of a flash EPROM chip and to have a very cost-effective product.

Another feature of the present invention is to provide a negative voltage switching circuit that applies a negative voltage to the gates of memory cells of a nonvolatile memory, thus allowing negative gate erasure of the memory.

A further feature of the present invention is to provide a negative voltage switching circuit for a nonvolatile memory that includes minimal elements.

A negative voltage switching circuit in a nonvolatile memory includes a switching transistor coupled to an output of the voltage switching circuit and to a first voltage source that has a voltage level substantially lower than zero volts. A pull-up circuit is coupled to a control terminal of the switching transistor and selectively to a second voltage source having a voltage level substantially above zero volts. The pull-up circuit applies the second voltage source to the control terminal of the switching transistor when the pull-up circuit is coupled to the second voltage source such that the switching transistor does not couple the first voltage source to the output. A pull-down circuit is coupled to the first voltage source and the control terminal of the switching transistor. The pull-down circuit applies the first voltage source to the control terminal of the switching transistor when the pull-up circuit is not coupled to the second voltage source such that the switching transistor couples the first voltage source to the output.

A nonvolatile memory includes a memory cell, a word line coupled to a gate of the memory cell, and a negative voltage switching circuit coupled to the word line. The negative voltage switching circuit allows a first voltage having a voltage level substantially lower than zero volts to be coupled to the gate of the memory cell during erasure of the memory cell. The negative voltage switching circuit further includes a switching transistor coupled to the word line and the first voltage source. A transistor is coupled to a control terminal of the switching transistor and selectively to a second voltage source having a voltage level substantially above zero volts. The transistor applies the second voltage source to the control terminal of the switching transistor when the transistor is coupled to the second voltage source such that the switching transistor does not couple the first voltage source to the gate of the memory cell via the word line. A resistor is coupled to the first voltage source and the control terminal of the switching transistor. The resistor applies the first voltage source to the control terminal of the switching transistor when the transistor is not coupled to the second voltage source such that the switching transistor couples the first voltage source to the gate of the memory cell via the word line.

BRIEF DESCRIPTION OF THE DRAWINGS

The present invention is illustrated by way of example and not by way of limitation in the figures of the accompanying drawings, in which like references indicate similar elements and in which.

DETAILED DESCRIPTION OF THE PREFERRED EMBODIMENTS

Figure 1:
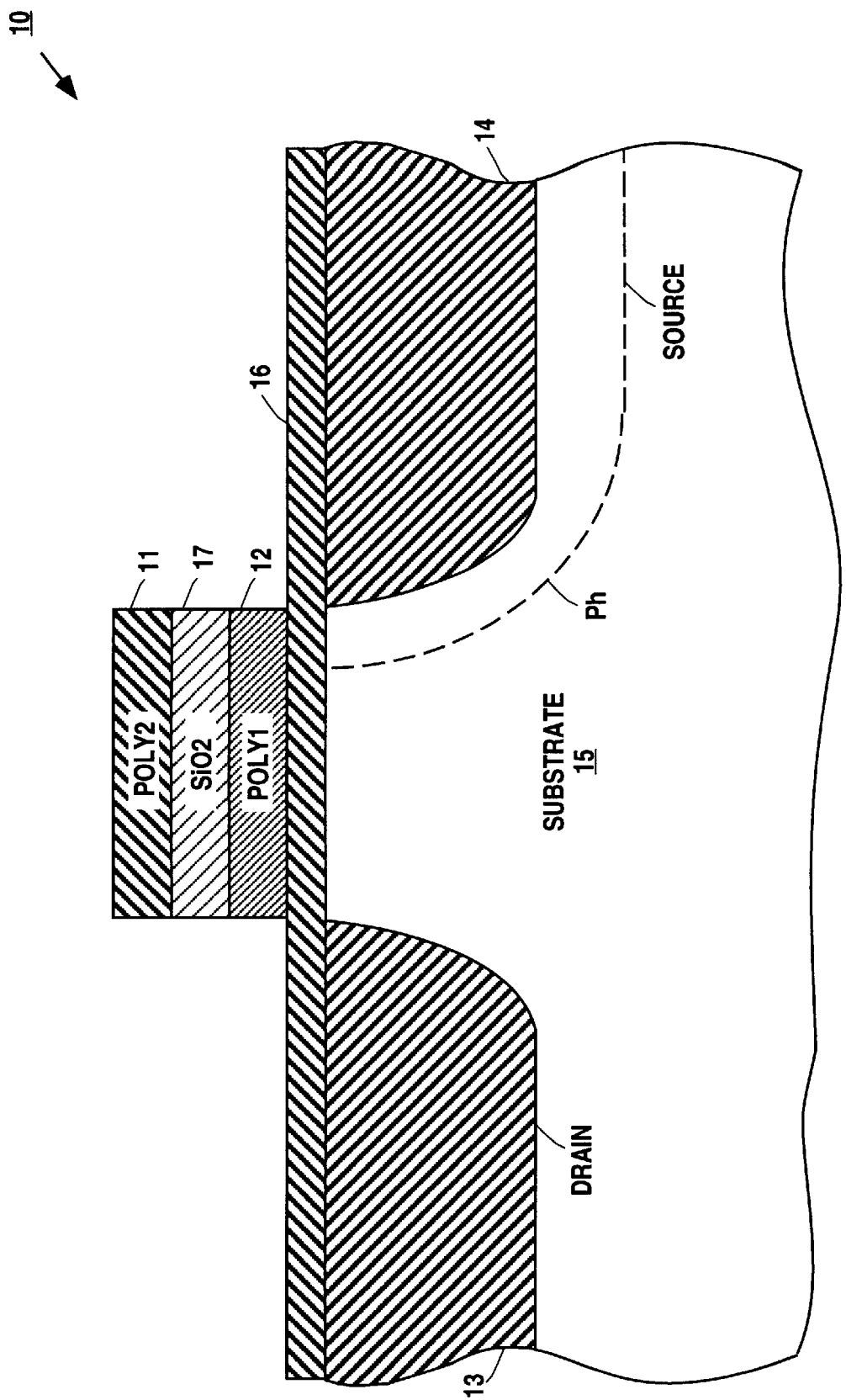
FIG. 1 shows a prior art floating gate flash EPROM cell.
Figure 2A:
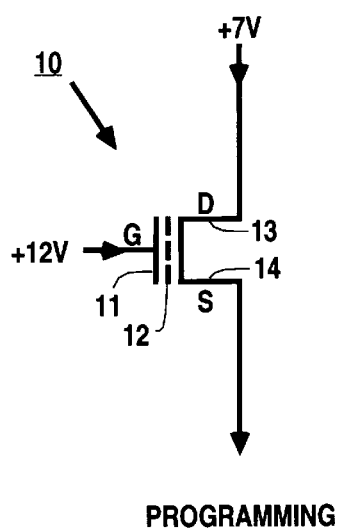
FIGS. 2A and 2B show a prior art arrangement of programming and erasing the floating gate flash EPROM cell of FIG. 1.
Figure 2B:
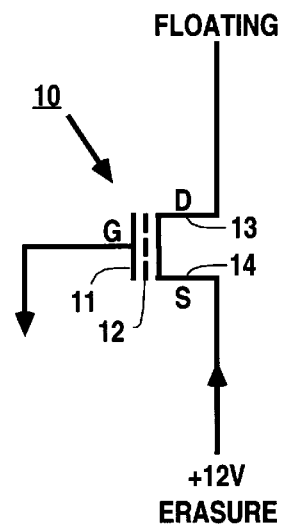
Figure 3:
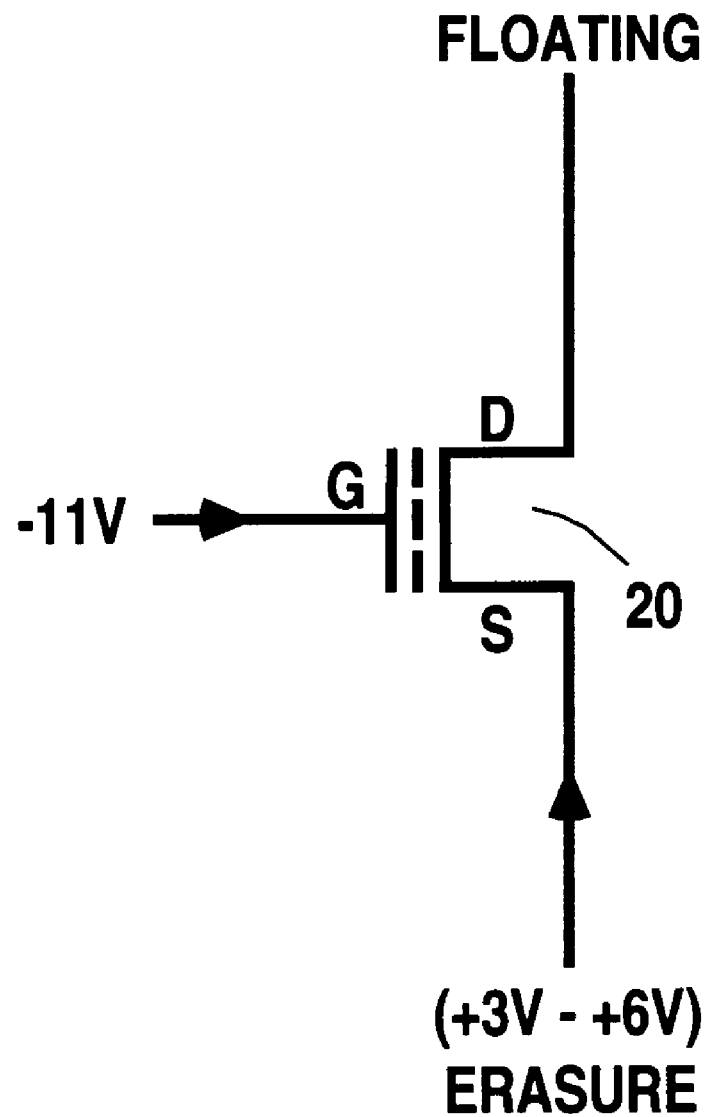
FIG. 3 shows an arrangement of erasing a floating gate flash EPROM cell with a negative gate voltage.

FIG. 3 shows an arrangement of erasing a flash EPROM cell 20 with a negative voltage. As can be seen from FIG. 3, the gate of memory cell 20 is applied with a negative voltage (i.e., −11 volts) instead of the ground voltage. In addition, the source of memory cell 20 is applied with a positive voltage (e.g., +6 volts) that is substantially lower than a typical 12 volt erasure voltage. By doing so, the voltage across the gate and source of memory cell 20 is increased (i.e., higher than 12 volts) without causing the source-to-gate junction of memory cell 20 to enter into the breakdown region. This erasure is referred to as negative gate erasure. The negative gate erasure increases the erasure speed while preventing the source-to-gate junction of the memory cell from entering into the breakdown region that is detrimental to the memory cell.

In order to apply a negative voltage to the gates of memory cells of a flash EPROM during the erasure operation of the flash EPROM, a negative voltage switching circuit is required. As will be described in more detail below, the negative voltage switching circuit, in accordance with one embodiment of the present invention, includes a P-channel switching transistor that, when turned on, couples a negative voltage to local word lines. The negative voltage switching circuit also includes a pull-up circuit formed by another P-channel transistor that selectively couples a positive voltage to the control terminal of the switching transistor and a pull-down circuit formed by a resistor that couples the negative voltage to the control terminal of the switching transistor when the pull-up circuit does not couple the positive voltage to the control terminal of the switching transistor. When the pull-up circuit couples the positive voltage to the control terminal of the switching transistor, the switching transistor is turned off and does not couple the negative voltage to the word lines. When the pull-up circuit does not couple the positive voltage to the control terminal of the switching transistor, the pull-down circuit causes the negative voltage to be applied to the control terminal of the switching transistor which turns on the switching transistor to couple the negative voltage to the word lines. The negative voltage switching circuit in accordance with one embodiment of the present invention will be described in more detail below, in conjunction with FIGS. 4–9.

Figure 4:
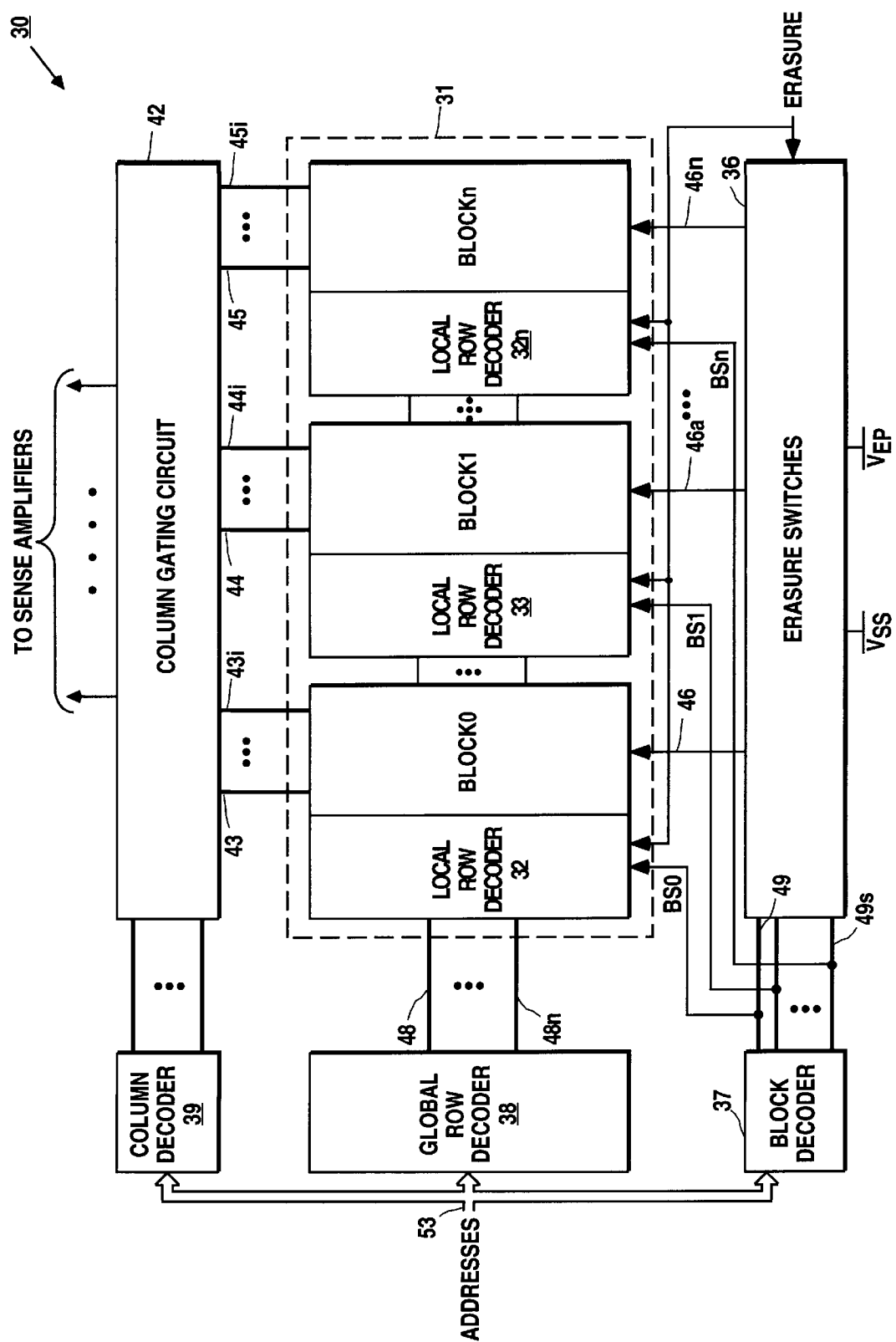
FIG. 4 shows the architecture of a flash EPROM that implements negative gate erasure in accordance with one embodiment of the present invention.

FIG. 4 is a block diagram of a flash EPROM 30, which implements the negative voltage switching circuit for allowing negative gate erasure of flash EPROM 30 in accordance with one embodiment of the present invention. Flash EPROM 30 includes a memory array 31, which is made up of floating gate flash EPROM cells that store data at addresses. For one embodiment, memory array 31 stores 8 Mbits ("Megabits") of data. For alternative embodiments, memory array 31 can be smaller than or larger than 8 Mbits.

Flash EPROM 30 can be used in any kind of computer system or data processing system. The computer system within which flash EPROM 30 is used can be a personal computer, a notebook, a laptop, a personal assistant/communicator, a minicomputer, a workstation, a mainframe, a multiprocessor computer, or any other type of computer system. In addition, the system in which flash EPROM 30 is used can be a printer system, a cellular phone system, a digital answering system, or any other data storage system.

For one embodiment, all the circuitry of flash EPROM 30 resides on a single semiconductor substrate.

For one embodiment, each memory cell of memory array 31 can store one bit of data at one time. For another embodiment, each memory cell of memory array 31 can store multiple bits of data at one time.

Memory array 31 is arranged into a number of blocks (i.e., BLOCK0 through BLOCKn). Each of the blocks includes a local row decoder. For example, block BLOCK0 includes a local row decoder 32. Each of the blocks includes a number of bit lines that only extend within that particular block and a number of local word lines that only extend within the block. Memory cells are placed at intersections of the local word lines and bit lines. All the bit lines of memory array 31 are connected to a column decoder 39 via a column gating circuit 42.

Figure 5:
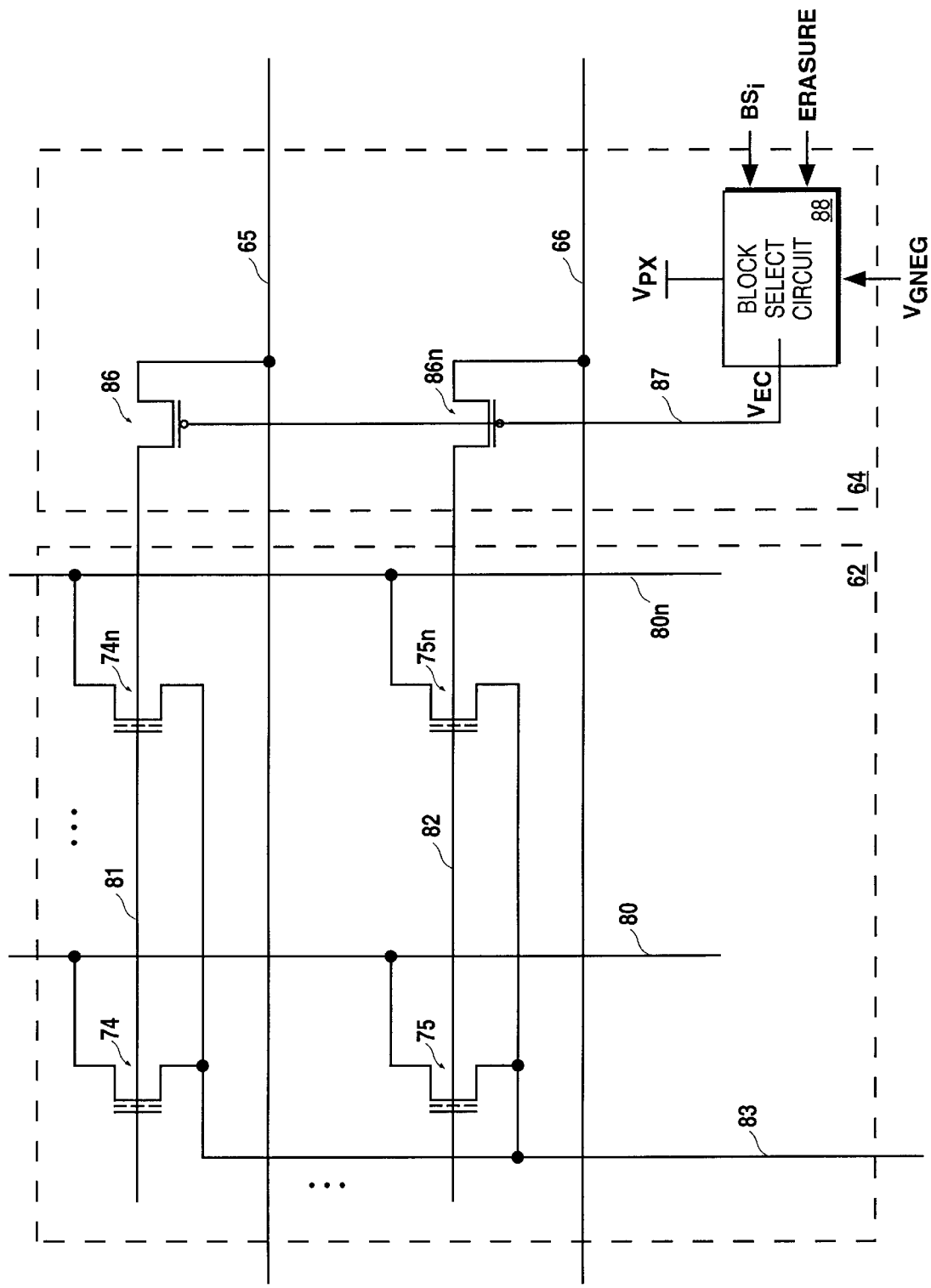
FIG. 5 shows the configuration of a block and its local row decoder of FIG. 4.

The local word lines within each of blocks BLOCK0–BLOCKn are connected to the local row decoder of the respective block. In addition, memory array 31 also includes a number of global word lines 48 through 48n connected to a global row decoder 38. Global word lines 48–48n are connected to each of local row decoders 32 through 32n and extend through all of blocks BLOCK0–BLOCKn. Global word lines 48–48n are, however, not physically connected to the local word lines of each block of memory array 31 but can be electrically connected to the local word lines of each block via the respective local row decoder of that block. FIG. 5 shows the configuration of each of blocks BLOCK0–BLOCKn, which will be described in more detail below.

Global row decoder 38 is the row decoder of memory array 31 and receives a row address from an address bus 53 to select one of global word lines 48–48n.

Each of local row decoders 32–32n includes a number of switching (or select) transistors (not shown), each for connecting a local word line to a corresponding global word line. Each of local row decoders 32–32n receives a block select signal from a block decoder 37. For example, local row decoder 32 receives a block select signal BS0. The block select signal for a local row decoder, when asserted, causes all switching transistors of the respective local row decoder to be turned on. When the block select signal for a local decoder is not asserted, the switching transistors of the respective local row decoder are turned off. This therefore allows the local word lines of a block to be isolated from the global word lines and from the local word lines of other blocks during memory operations. Each of local row decoders 32–32n also receives an erasure control signal (i.e., the ERASURE signal).

Block decoder 37 selects a selected block for every block address applied. Block decoder 37 selects the selected block by asserting the appropriate one of the block select signals BS0–BSn. Block decoder 37 is also connected to bus 53 for receiving the block address.

Erasure switches 36 include a number of switches (not shown in FIG. 4), each being coupled to the common source line of one block of blocks BLOCK0–BLOCKn. Each of erasure switches 36 selectively connects the $V_{SS}$ (i.e., ground) or $V_{EP}$ (i.e., erasure) voltage to one of common source lines 46–46n of its associated block in accordance with the block select signal from one of select lines 49–49s and in accordance with the memory operations (i.e., read, programming, and erasure operations). This means that erasure switches 36 will apply the $V_{SS}$ voltage to all common source lines 46–46n during read and programming operations of flash EPROM 30 regardless of the block select signals BS0–BSn. When flash EPROM 30 undergoes the erasure operation (indicated by the ERASURE signal), block decoder 37 asserts the selected block signal that causes the corresponding switch of erasure switches 36 to apply the $V_{EP}$ voltage to the selected block while other switches of erasure switches 36 apply the $V_{SS}$ voltage to their blocks.

In one embodiment, the $V_{EP}$ voltage is approximately 6 volts. Alternatively, the $V_{EP}$ voltage can be higher or lower than 6 volts.

FIG. 5 shows the configuration of a block 62 and the associated local row decoder 64. Block 62 can be any one of blocks BLOCK0–BLOCKn of FIG. 4 and local row decoder 64 can be any one of local decoders 32–32n. FIG. 5 only shows two global word lines 65 and 66 that extend through block 62. In fact, global word lines 65 and 66 are any two global word lines of global word lines 48–48n of FIG. 4.

Block 62 includes bit lines 80–80m. In addition, block 62 includes a number of local word lines, each corresponding to a global word line. For example, local word line 81 is connected to global word line 65 via a switching transistor 86 of local row decoder 64 and local word line 82 is connected to global word line 66 via a switching transistor 86n of local row decoder 64. FIG. 5 only shows two local word lines. In practice, block 22 includes many more local word lines.

In one embodiment, each of switching transistors 86–86n is a P-channel MOSFET (Metal Oxide Silicon Field Effect Transistor). Using P-channel transistors as switching transistors 86–86n allows passage of a negative voltage to each of the local word lines during erasure of block 62. Alternatively, switching transistors 86–86n can be replaced with other switching circuits that allow negative voltages to pass.

Block 62 has a common source line 83 which is connected to one of erasure switches 36 (FIG. 4). In addition, block 62 includes flash EPROM cells 74 through 74n and 75 through 75n, each having its drain connected to a bit line, its control gate connected to a local word line, and its source connected to common source line 83.

Figure 6:
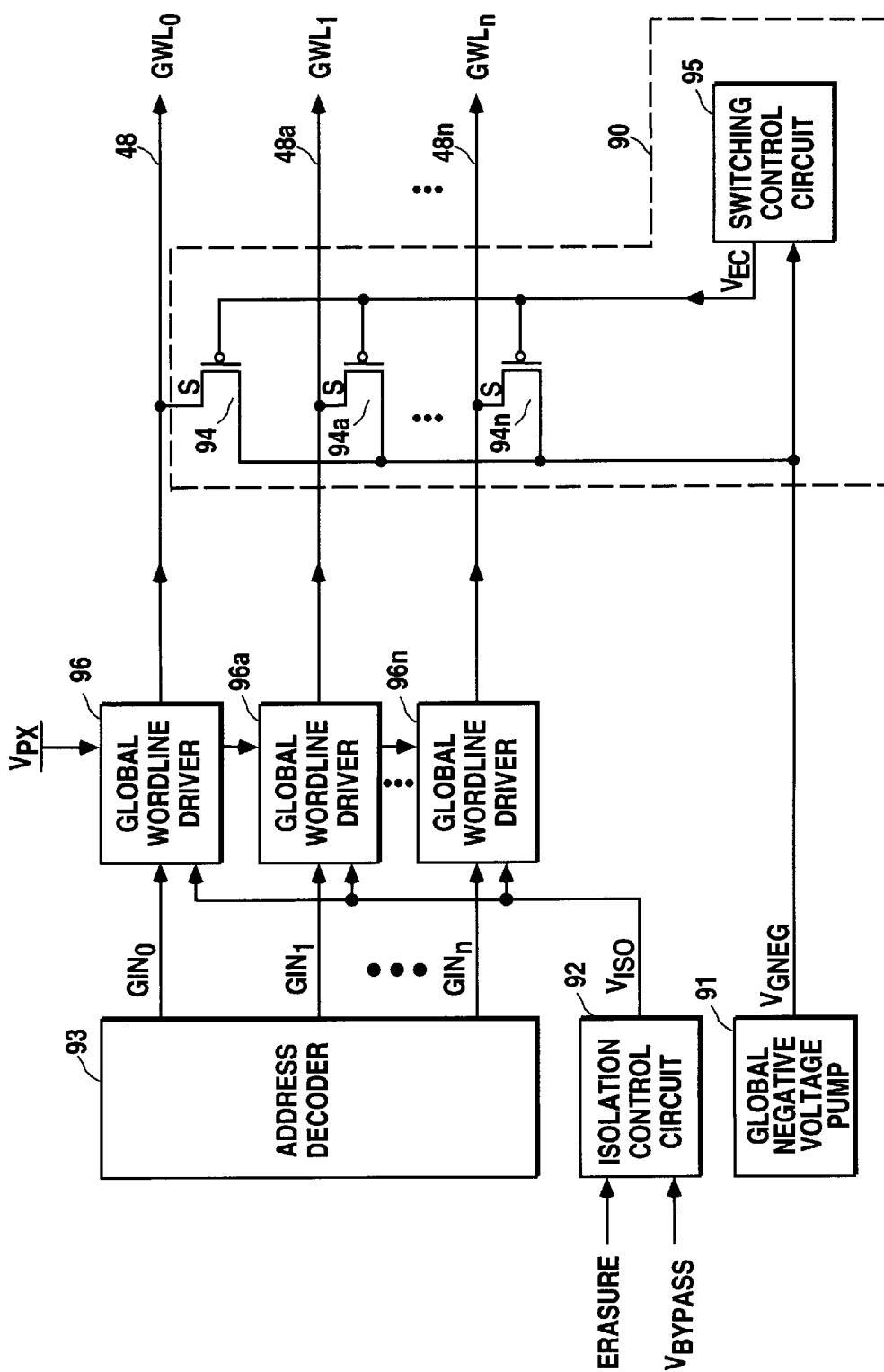
FIG. 6 shows the configuration of the global row decoder of FIG. 4 that includes a negative voltage switching circuit for applying a negative gate voltage to the global word lines during erasure of the flash EPROM in accordance with one embodiment of the present invention.

As can be seen from FIG. 5, local row decoder 64 includes a block select circuit 88 besides switching transistors 86–86n. Each of switching transistors 86–86n is connected to block select circuit 88 via line 87. Block select circuit 88 receives a block select BSi signal which can be any one of the block select signals BS0–BSn from block decoder 37 of FIG. 4. Block select circuit 88 is also coupled to a $V_{PX}$ power supply voltage and a $V_{GNEG}$ negative voltage from a global negative voltage pump 91 as shown in FIG. 6. The voltage levels of the $V_{PX}$ and $V_{GNEG}$ voltages during read, programming, and erasure operations are shown in Table I below.

Figure 8:
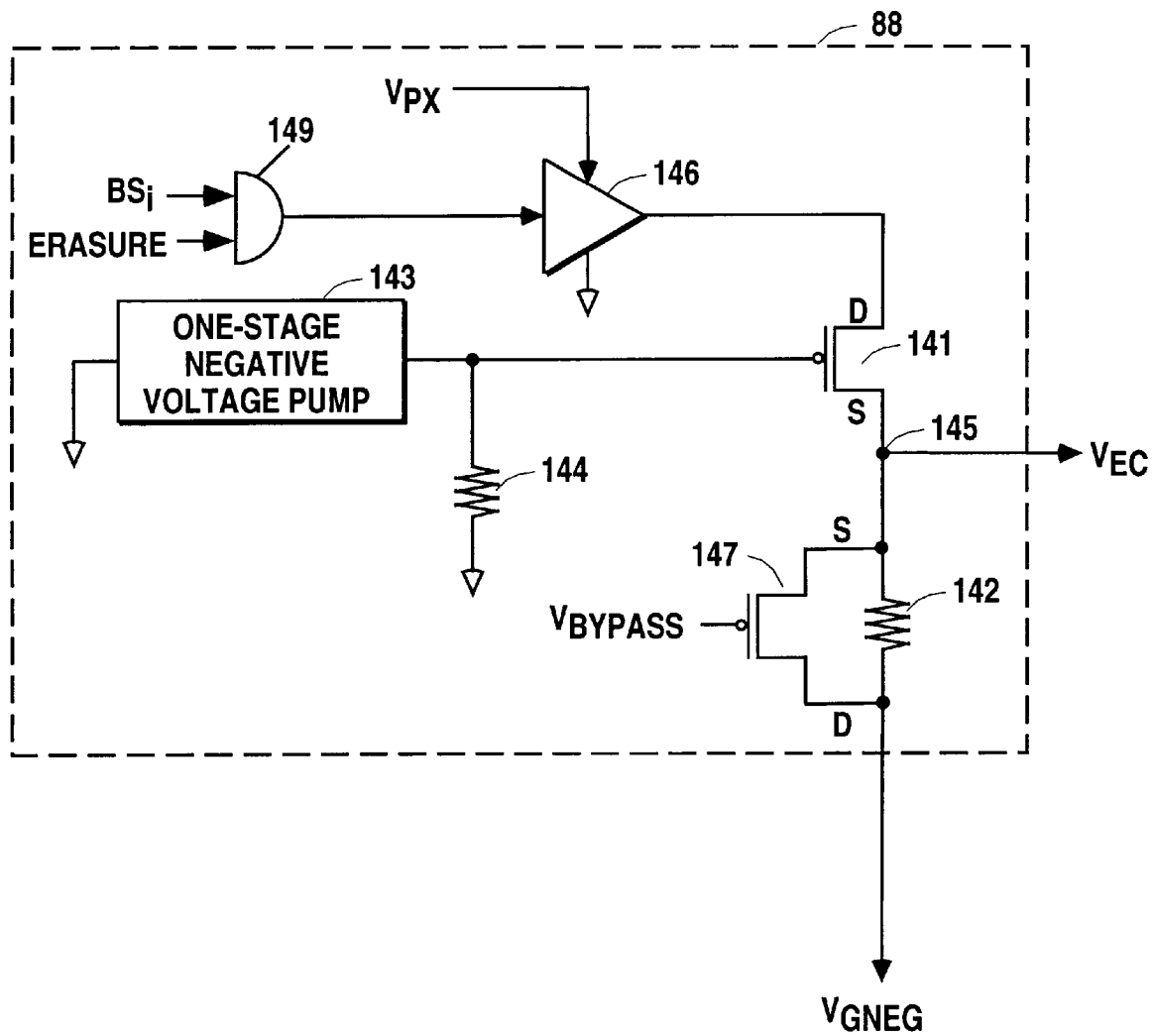
FIG. 8 shows the switching control circuit of FIG. 5 in accordance with another embodiment of the present invention.

Block select circuit 88 includes a driver circuit and a negative voltage switching control circuit (both are not shown). The circuit configuration of block select circuit 88 is shown in FIG. 8, which will be described in more detail below.

Block select circuit 88 functions in accordance with the BSi block select signal. When the BSi signal is asserted, block select circuit 88 causes switching transistors 86–86n to be turned on. When the BSi signal is not asserted, block select circuit 88 does not turn on switching transistors 86–86n.

In accordance with one embodiment of the present invention, a negative voltage is applied to the control gate of each of the memory cells of block 62 during erasure operation of block 62 for the negative gate erasure. This thus requires each of local word lines 81 and 82 to be switched to the negative voltage during erasure. As can be seen from FIG. 5, each of local word lines 81 and 82 is connected to one of global word lines 65 and 66 via one of switching transistors 86–86n. Thus, for allowing a local word line to receive the negative voltage, its corresponding global word line needs to receive the negative voltage such that the negative voltage can be applied to the corresponding local word lines. When this occurs, another negative voltage is also required to switch on the corresponding switching transistor. In this case, block select circuit 88 needs to have the negative voltage switching control circuit to couple the negative voltage $V_{LNEG}$ onto the gate of each of switching transistors 86–86n during erasure of block 62.

When block 62 is selected for an erasure operation, the block driver of block select circuit 88 does not function. Meanwhile, the switching control circuit of block select circuit 88 is controlled by the BSi and ERASURE signals to generate a negative voltage $V_{EC}$ to each of switching transistors 86–86n in accordance with the $V_{LNEG}$ voltage. The negative voltage $V_{EC}$ turns on transistors 86–86n when global word lines 81 and 82 are connected to a negative voltage. This in turn causes each of local word lines 81 and 82 to be connected to the negative voltage.

Below is a table showing the voltage levels of some of the signals in FIG. 5.

TABLE I

| | | PROGRAM | | ERASURE | |
| --- | --- | --- | --- | --- | --- |
| $BS_i$ | READ LOGIC HIGH | SELECT LOGIC HIGH | DESELECT LOGIC LOW | SELECT LOGIC HIGH | DESELECT LOGIC LOW |
| $V_{PX}$ | 5V | 11V | | 0V | |
| $V_{LNEG}$ | -5V | -2V | | -11V | |
| $V_{EC}$ | -5V | -2V | 11V | -11V | 0V |

FIG. 6 shows global row decoder 38 of FIG. 4 configured with a negative voltage switching circuit 90 that supplies a negative voltage $V_{GNEG}$ to the global word lines of flash EPROM 30 for the negative gate erasure in accordance with one embodiment of the present invention. As can be seen from FIG. 6, global row decoder 38 includes an address decoder 93 coupled to a number of global word line drivers 96 through 96n. The output of each of drivers 96–96n is connected to one of global word lines 48–48n. Each of drivers 96–96n is also controlled by a $V_{ISO}$ isolation signal from an isolation control circuit 92. The $V_{ISO}$ isolation signal, when enabled, isolates the N-channel transistor (not shown) in each of drivers 96–96n from the negative voltage applied to the global word lines 48–48n such that the N-channel transistor in each of drives 96–96n is not damaged by the negative voltage. Isolation control circuit 92 asserts the $V_{ISO}$ signal during erasure of flash EPROM 30. The circuit of isolation control circuit 92 will be described in more detail below, in conjunction with FIG. 9.

Figure 7:
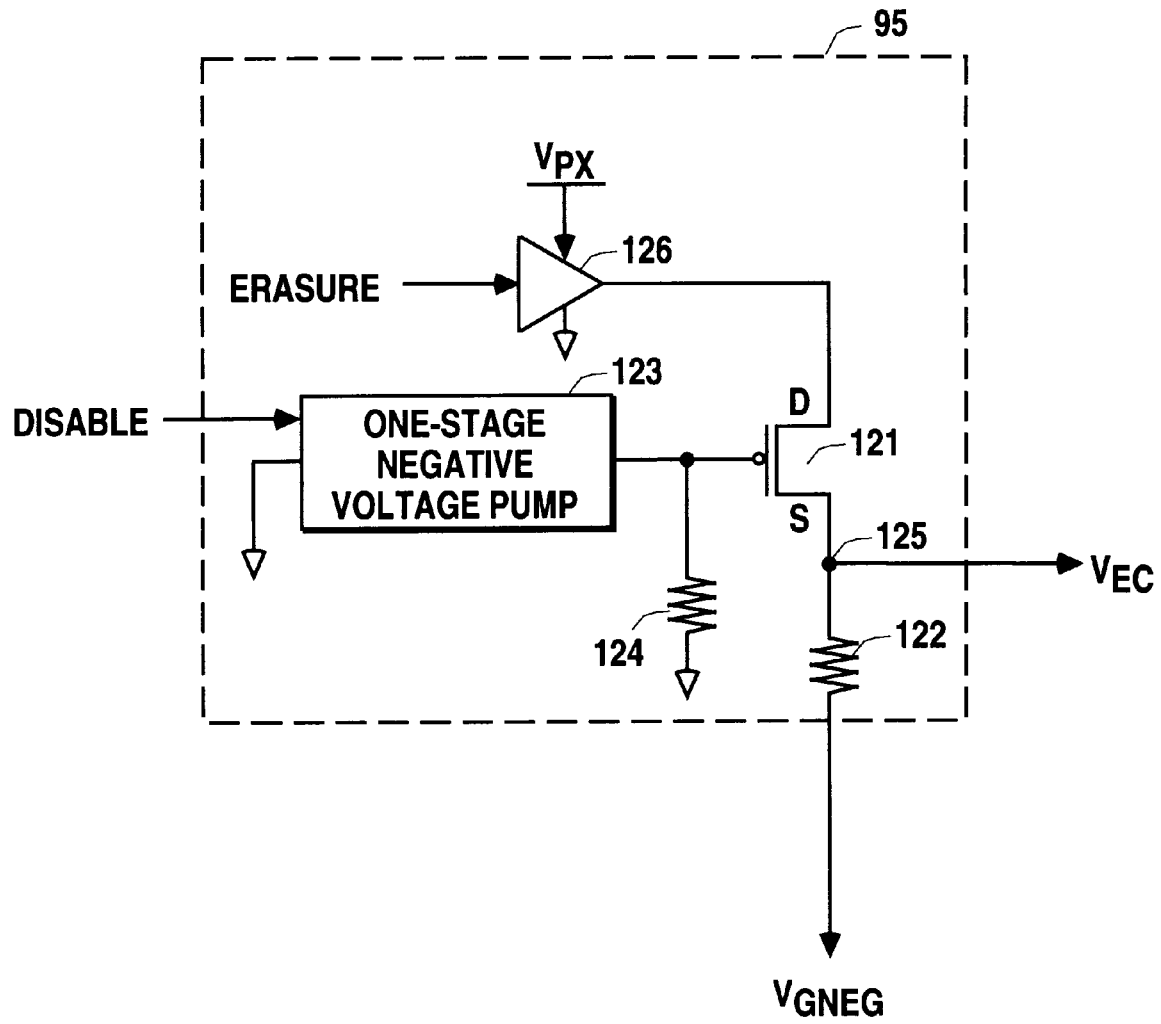
FIG. 7 shows the switching control circuit of FIG. 6.

Switching circuit 90 includes a number of P-channel negative voltage switching transistors connected to global word lines 48–48n. Each P-channel switching transistor of switching circuit 90 has its source connected to its respective global word line and its drain connected to receive the $V_{GNEG}$ negative voltage from global negative voltage pump 91 during erasure operation. Global negative voltage pump 91 can be implemented by any known voltage pump circuit that can generate negative voltages. The gate of each of switching transistors 94–94n is connected to and controlled by a switching control circuit 95. Switching control circuit 95 is controlled by an array plane select signal. The circuit of switching control circuit 95 is shown in FIG. 7, which will be described in more detail below.

During erasure operation, the ERASURE signal is asserted which causes the $V_{ISO}$ signal to be at zero volts. The zero-volt $V_{ISO}$ signal isolates the negative voltage applied to the global word lines from being coupled to the N-channel transistor in each of the drivers 96–96n. Meanwhile, switching control circuit 95 of negative voltage switching circuit 90 applies a negative $V_{EC}$ voltage (i.e., approximately -11 volts) to the gate of each of switching transistors 94–94n, thus turning on each of switching transistors 94–94n. This in turn causes the negative voltage $V_{GNEG}$ to be applied to each of global word lines 48–48n. As described above, for allowing a P-channel transistor to pass a global negative voltage, another negative voltage is required to be applied to the gate of the P-channel transistor.

During non-erasure (i.e., read or programming) operation, global negative voltage pump 91 passes positive $V_{GNEG}$ voltage to transistors 94–94n and switching control circuit 95 causes the $V_{EC}$ voltage also be positive. This in turn turns off transistors 94–94n, thus decoupling global negative voltage switching circuit 90 from global word lines 48–48n during non-erasure operation.

Below is a table showing the voltage level of some of the signals in FIG. 6.

TABLE II

| | | | ERASURE | |
| --- | --- | --- | --- | --- |
| | READ | PROGRAM | SELECT | DESELECT |
| $V_{ISO}$ | -5V | -2V | 0V | |
| $V_{PX}$ | 5V | 11V | 0V | |
| $V_{GNEG}$ | 5V | 11V | -11V | |
| $V_{EC}$ | 5V | 11V | -11V | 0V |
| ERASURE | LOGIC LOW | LOGIC LOW | LOGIC HIGH | |

FIG. 7 shows the circuit configuration of switching control circuit 95 of FIG. 6. As can be seen from FIG. 7, switching control circuit 95 includes a P-channel MOSFET transistor 121 having its source coupled to an output node 125 and its drain coupled to selectively receive a $V_{PX}$ voltage or a ground voltage. The $V_{PX}$ voltage is at approximately 5 volts when flash EPROM 30 (FIG. 4) is undergoing the read operation and is at approximately 11 volts when flash EPROM 30 (FIG. 4) is undergoing the programming operation. Transistor 121 may be other type of transistor.

The function of transistor 121 is to pass either the $V_{PX}$ or the ground voltage to node 125 when transistor 121 is turned on. The gate of transistor 121 is connected to ground via a resistor 124. In addition, the gate of transistor 121 is connected to a negative voltage negative voltage pump 123. Pump 123 is a small one-stage negative voltage pump that, when not disabled, generates a negative voltage to turn on transistor 121 when the ground voltage is applied to the drain of transistor 121. This causes node 125 to be tied to the ground voltage. The disable signal for negative voltage pump 123 can be, for example, the block select signal of a block or a plane select signal for flash EPROM 30. When flash EPROM 30 includes the plane select signal, it means memory array 31 (FIG. 4) is arranged into two or more memory planes.

In addition, control circuit 95 also includes a resistor 122 connected to node 125 and to negative voltage pump 91 (FIG. 6). In one embodiment, each of resistors 122 and 124 is fabricated by a polysilicon resistor.

Resistor 124 connects ground to the gate of transistor 121 when negative voltage pump 123 is off. In addition, the ERASURE signal controls the application of the $V_{PX}$ voltage to the drain of transistor 121. During non-erasure operations, the ERASURE signal is not asserted, which causes driver circuit 126 to apply the $V_{PX}$ voltage to the drain of transistor 121. At this time, negative voltage pump 123 is not on and the gate of transistor 121 receives the ground voltage. This turns on transistor 121, applying the $V_{PX}$ positive voltage to node 125. As a result, the $V_{EC}$ voltage at node 125 is forced to the $V_{PX}$ positive voltage even through the negative voltage $V_{GNEG}$ is constantly applied to resistor 122. Here, resistor 122 isolates the negative voltage $V_{GNEG}$ from node 125. When the $V_{EC}$ voltage assumes the $V_{PX}$ voltage, the switching transistors (e.g., transistors 94–94n of FIG. 6) are turned off.

During erasure operation, the ERASURE signal is asserted which couples the ground voltage to the drain of transistor 121. At this moment, pump 123 is turned on if the block or memory plane with which control circuit 120 is associated is not the selected block or memory plane for the erasure operation. This causes transistor 121 to be turned on, passing the ground voltage to node 125. This in turn causes the $V_{EC}$ voltage to be at the ground voltage, turning all the switching transistors (e.g., transistors 94–94n of FIG. 6) off.

When, however, the memory plane with which control circuit 95 is associated is the selected block or memory plane, pump 123 is turned off by the disable signal. This causes transistor 121 to be turned off. Meanwhile, resistor 122 allows the negative voltage $V_{GNEG}$ to be applied to node 125, causing the $V_{EC}$ voltage to assume the $V_{GNEG}$ negative voltage. When the $V_{EC}$ voltage becomes the $V_{GNEG}$ negative voltage, the switching transistors (e.g., transistors 94–94n of FIG. 6) are turned on, passing the $V_{GNEG}$ negative voltage to the global word lines.

FIG. 8 shows the circuit of block select circuit 88 of FIG. 5. As can be seen from FIGS. 7 and 8, circuit 88 of FIG. 8 is basically identical to circuit 95 of FIG. 7, except transistor 147 in FIG. 8. As can be seen from FIG. 8, driver 146 is the driver circuit of block select circuit. As also can be seen from FIG. 8, transistor 147 is a P-channel transistor connected in parallel with resistor 142. Thus, transistor 147 is a bypass transistor that, when turned on by the $V_{BYPASS}$ bypass signal, causes node 145 to bypass resistor 142 and to be directly connected to global negative voltage pump 91 as shown in FIG. 6. This allows node 145 to be quickly charged during power up and programming operation. The bypass is controlled by the $V_{BYPASS}$ signal which is generated by other circuits of flash EPROM 30 (not shown).

Figure 9:
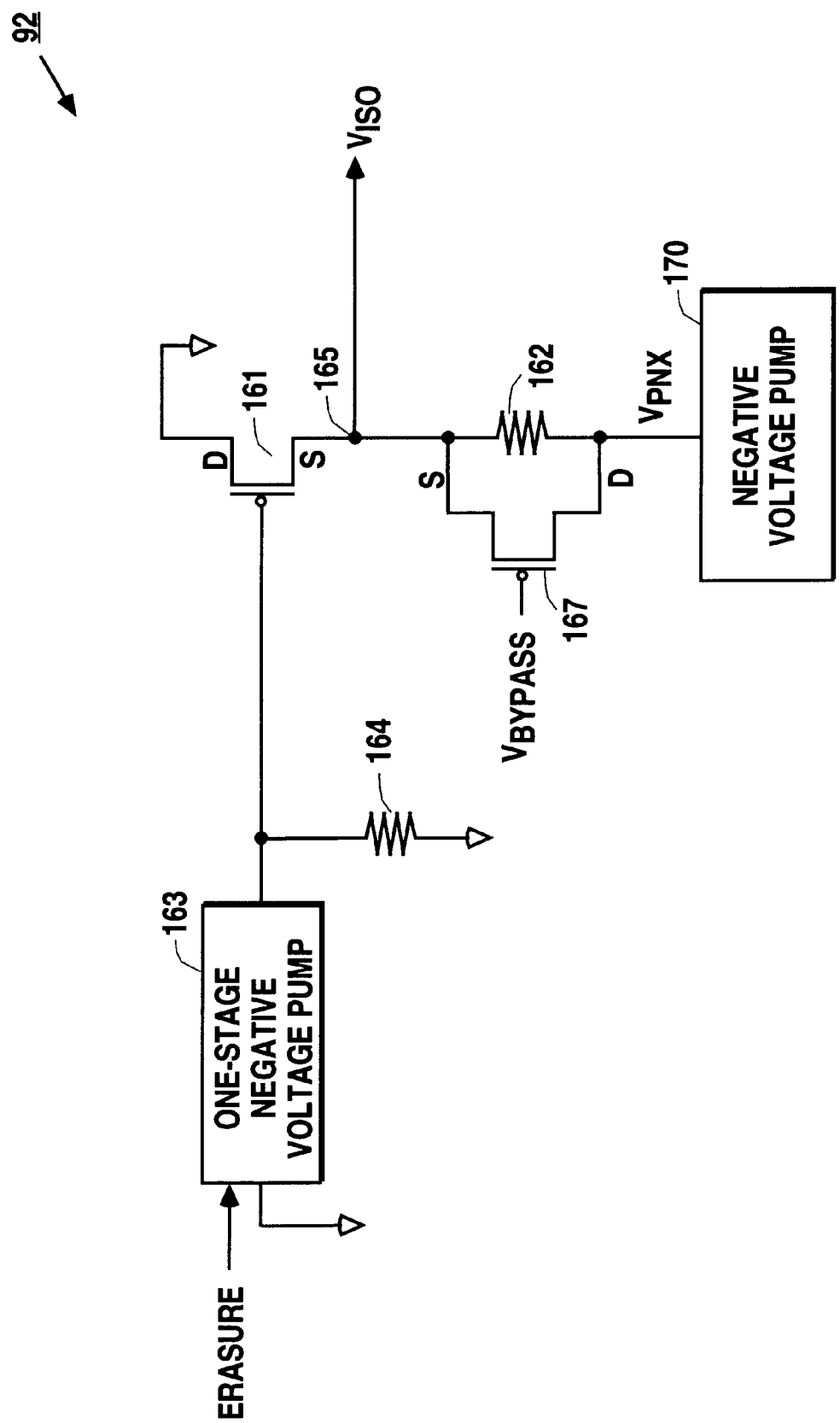
FIG. 9 shows the circuit of the isolation circuit of FIG. 6.

Referring now to FIG. 9, the circuit of isolation control circuit 92 of FIG. 6 is shown. As can be seen from FIGS. 8 and 9, isolation control circuit 92 of FIG. 9 has basically the same circuit configuration as circuit 88 of FIG. 8, except that transistor 161 has its drain constantly connected to ground. This causes the $V_{ISO}$ voltage to equal the $V_{PNX}$ voltage from negative voltage pump 170 during non-erasure operation. During erasure operation, the ERASURE signal turns on pump 163, thus causing transistor 161 to be turned on. This in turn causes the $V_{ISO}$ voltage to be at the ground voltage. Negative voltage pump 170 causes the $V_{PNX}$ voltage to be at approximately −5 volts during real operation, at approximately −2 volts during programming operation, and at approximately −11 volts during erasure operation.

Below is the table showing the voltages of the signals in FIG. 9.

TABLE III

|  | READ | PROGRAM | ERASURE |
|---|---|---|---|
| $V_{PNX}$ | −5V | −2V | −11V |
| $V_{ISO}$ | −5V | −2V | 0V |

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A negative voltage switching circuit in a nonvolatile memory, comprising:
   (A) a switching circuit having a switching transistor coupled to an output of the negative voltage switching circuit and to a first voltage source that has a voltage level substantially lower than zero volts;
   (B) a pull-up circuit coupled to a control terminal of the switching transistor and selectively to a second voltage source having a voltage level substantially above zero volts, the pull-up circuit applying the second votage source to the control terminal of the switching transistor when the pull-up circuit is coupled to the second voltage source such that the switching transistor does not couple the first voltage source to the output;
   (C) a pull-down circuit coupled to the first voltage source and the control terminal of the switching transistor, the pull-down circuit applying the first voltage source to the control terminal of the switching transistor when the pull-up circuit is not coupled to the second voltage source such that the switching transistor couples the first voltage source to the output.

2. The negative voltage switching circuit of claim 1, wherein the voltage level of the first voltage source is approximately −11 volts, wherein the voltage level of the second voltage source is approximately 11 volts.

3. The negative voltage switching circuit of claim 1, wherein the switching transistor is a P-channel transistor.

4. The negative voltage switching circuit of claim 1, wherein the pull-up circuit further comprises
   (I) a first transistor having a first terminal coupled to the control terminal of the switching transistor and a second terminal selectively coupled to (1) the second voltage source and (2) ground;
   (II) a voltage pump coupled to a control terminal of the first transistor for applying a third voltage having a voltage level lower than zero volts to the control terminal of the first transistor;
   (III) a first resistor coupled (1) to ground and (2) to the voltage pump and the control terminal of the first transistor for coupling ground to the control terminal of the first transistor when the voltage pump does not apply the third voltage to the control terminal of the first transistor, wherein when the first terminal and the control terminal of the first transistor are coupled to ground, the first transistor is turned off at which time the pull-down circuit couples the first voltage source to the control terminal of the switching transistor.

5. The negative voltage switching circuit of claim 4, wherein the pull-up circuit further comprises a switching logic that couples the second voltage to the second terminal of the first transistor under control of a control signal.

6. The negative voltage switching circuit of claim 4, wherein the first transistor is a P-channel transistor, wherein the first resistor is fabricated by a first polysilicon resistor.

7. The negative voltage switching circuit of claim 1, wherein the pull-down circuit further comprises
   (i) a second resistor coupled to the first voltage source and the control terminal of the switching transistor;
   (ii) a second transistor coupled in parallel with the second resistor and to the control terminal of the switching transistor and the first voltage source, the second transistor causing the first voltage source to bypass the second resistor of the pull-down circuit when turned on.

8. The negative voltage switching circuit of claim 7, wherein the second transistor is a P-channel transistor, wherein the second resistor is fabricated by a first polysilicon resistor.

9. A nonvolatile memory, comprising:
   (A) a memory cell;
   (B) a word line coupled to a gate of the memory cell;
   (C) a negative voltage switching circuit coupled to the word line, the negative voltage switching circuit allowing a first voltage having a voltage level substantially lower than zero volts to be coupled to the gate of the memory cell during erasure of the memory cell, the negative voltage switching circuit further comprising (I) a switching transistor coupled to the word line and the first voltage source;

(II) a pull-up circuit coupled to a control terminal of the switching transistor and selectively to a second voltage source having a voltage level substantially above zero volts, the pull-up circuit applying the second voltage source to the control terminal of the switching transistor when the pull-up circuit is coupled to the second voltage source such that the switching transistor does not couple the first voltage source to the gate of the memory cell via the word line;

(III) a pull-down circuit coupled to the first voltage source and the control terminal of the switching transistor, the pull-down circuit applying the first voltage source to the control terminal of the switching transistor when the pull-up circuit is not coupled to the second voltage source such that the switching transistor couples the first voltage source to the memory cell via the word line.

10. The nonvolatile memory of claim 9, wherein the voltage level of the first voltage source is approximately −11 volts, wherein the voltage level of the second voltage source is approximately 11 volts.

11. The nonvolatile memory of claim 9, wherein the nonvolatile memory is an electrically erasable and programmable read only memory.

12. The nonvolatile memory of claim 9, wherein the switching transistor is a P-channel transistor.

13. The nonvolatile memory of claim 9, wherein the pull-up circuit further comprises (I) a first transistor having a first terminal coupled to the control terminal of the switching transistor and a second terminal selectively coupled to (1) the second voltage source and (2) ground;

(II) a voltage pump coupled to a control terminal of the first transistor for applying a third voltage having a voltage level lower than zero volts to the control terminal of the first transistor;

(III) a first resistor coupled (1) to ground and (2) to the voltage pump and the control terminal of the first transistor for coupling ground to the control terminal of the first transistor when the voltage pump does not apply the third voltage to the control terminal of the first transistor, wherein when the first terminal and the control terminal of the first transistor are coupled to ground, the first transistor is turned off at which time the pull-down circuit couples the first voltage source to the control terminal of the switching transistor.

14. The nonvolatile memory of claim 13, wherein the pull-up circuit further comprises a switching logic that couples the second voltage to the second terminal of the first transistor under control of a control signal.

15. The nonvolatile memory of claim 13, wherein the first transistor is a P-channel transistor, wherein the first resistor is fabricated by a first polysilicon resistor.

16. The nonvolatile memory of claim 9, wherein the pull-down circuit further comprises (i) a second resistor coupled to the first voltage source and the control terminal of the switching transistor;

(ii) a second transistor coupled in parallel with the second resistor and to the control terminal of the switching transistor and the first voltage source, the second transistor causing the first voltage source to bypass the second resistor of the pull-down circuit when turned on.

17. The nonvolatile memory of claim 16, wherein the second transistor is a P-channel transistor, wherein the second resistor is fabricated by a first polysilicon resistor.

18. A voltage switching circuit in a nonvolatile memory, comprising:

(A) a switching transistor coupled to an output of the voltage switching circuit and a first voltage source that has a voltage level substantially lower than zero volts;

(B) a first transistor coupled to a control terminal of the switching transistor and selectively to a second voltage source having a voltage level substantially above zero volts, the first transistor applying the second voltage source to the control terminal of the switching transistor when the first transistor is coupled to the second voltage source such that the switching transistor does not couple the first voltage source to the output;

(C) a first resistor coupled to the first voltage source and the control terminal of the switching transistor, the first resistor applying the first voltage source to the control terminal of the switching transistor when the first resistor is not coupled to the second voltage source such that the switching transistor couples the first voltage source to the output.

19. The negative voltage switching circuit of claim 18, further comprising (i) a second resistor coupled (1) to ground and (2) the control terminal of the first transistor;

(ii) a voltage pump coupled to the control terminal of the first transistor for applying a third voltage having a voltage level substantially below zero volts to the control terminal of the first transistor, the second resistor causes the control terminal to be coupled to ground when the voltage pump does not apply the third voltage to the control terminal of the first transistor.

20. The negative voltage switching circuit of claim 19, further comprising a second transistor coupled in parallel with the first resistor and to the control terminal of the switching transistor and the first voltage source, the second transistor causing the first voltage source to bypass the first resistor when turned on.

21. The negative voltage switching circuit of claim 20, wherein each of the first and second resistors is fabricated by a first polysilicon resistor, wherein each of the first and second transistors is a P-channel transistor, wherein the switching transistor is also a P-channel transistor.

22. The negative voltage switching circuit of claim 21, further comprising a switching logic that couples the second voltage to the first transistor under control of a control signal.

* * * * *

UNITED STATES PATENT AND TRADEMARK OFFICE
CERTIFICATE OF CORRECTION

PATENT NO. : 5,978,263
DATED : November 2, 1999
INVENTOR(S) : Javanifard et al.

It is certified that error appears in the above-identified patent and that said Letters Patent is hereby corrected as shown below:

Column 6,
Lines 51 and 60, delete "$V_{LNEG}$" and insert -- $V_{GNEG}$ --.

Column 8,
Line 28, delete the first occurrence of "negative voltage".
Line 29, insert -- Negative voltage -- at the beginning of the line.
Line 61, insert -- negative voltage -- before "pump".

Column 9,
Line 3, insert -- negative voltage -- before "pump".
Line 66, delete "votage" and insert -- voltage --.

Column 10,
Lines 43 and 56, delete "first" before "polysilicon resistor".

Column 11,
Line 55, delete "first" before "polysilicon resistor".

Column 12,
Lines 9 and 52, delete "first" before "polysilicon resistor".

Signed and Sealed this

Twenty-first Day of February, 2006

JON W. DUDAS
*Director of the United States Patent and Trademark Office*